United States Patent [19]

Welles, II et al.

[11] Patent Number: 4,630,299
[45] Date of Patent: Dec. 16, 1986

[54] DIGITAL CIRCUIT FOR DECODING DIGITIZED, DEMODULATED FM STEREO SIGNALS

[75] Inventors: Kenneth B. Welles, II, Schenectady; Sharbel E. Noujaim, Clifton Park; Jerome J. Tiemann, Schenectady, all of N.Y.

[73] Assignee: General Electric Company, Schenectady, N.Y.

[21] Appl. No.: 704,123

[22] Filed: Feb. 22, 1985

[51] Int. Cl.$^4$ .............................................. H04H 5/00
[52] U.S. Cl. .......................................... 381/4; 364/724
[58] Field of Search .............................. 381/2, 3, 4, 7; 364/724; 179/84 VF

[56] References Cited

U.S. PATENT DOCUMENTS 4,569,072  2/1986  Van Roermund ...................... 381/7

Primary Examiner—Forester W. Isen
Attorney, Agent, or Firm—Lawrence D. Cutter; James C. Davis, Jr.; Marvin Snyder

[57] ABSTRACT

A simple digital filter having only a single multiplier operates to extract the pilot tone from a demodulated and digitized FM stereo signal. The number of poles in the filter is chosen so that the filter output is also usable to produce a digitized representation of the carrier tone for the left minus right stereo channel. This signal is in turn used to decode the input representation into the desired left and right channel signals. The circuit of the present invention is particularly amenable to fabrication on an integrated circuit chip.

5 Claims, 3 Drawing Figures

DIGITAL CIRCUIT FOR DECODING DIGITIZED, DEMODULATED FM STEREO SIGNALS

BACKGROUND OF THE INVENTION

The present invention relates to digital circuits and in particular to digital filters for decoding demodulated FM stereo signals into left and right channels. Additionally, the digital circuits of the present invention are particularly directed to simplified circuits for stereo channel decoding which are particularly amenable to fabrication on integrated circuit chips, either alone or on the same chip with other FM and/or AM signal processing circuitry.

In stereo FM broadcasts, three fundamental signals are transmitted. One part of the signal spectrum is allotted to transmission of a signal representing the sum of the left and right channels. Another part of the spectrum is allotted to the transmission of a signal representing the difference between the left and right channels. A third part of the standard FM stereo broadcast signal includes a 19 kHz pilot tone. This tone is used in demodulating the signal into left and right channel portions.

The present invention is particularly directed to that part of the circuitry which receives a demodulated signal which has already been digitized. As used herein and in the appended claims, the term digitized refers to the conversion of periodically sampled analog signals into equivalent binary number representations. Typically each analog sample is converted into a representation in terms of a sequence of binary digits. However, it is noted that while the analog samples are typically converted into a binary representation in which each position in the representation corresponds to a particular weighting factor which is a power of two, other number representational systems may be employed without departing from the spirit of the invention which is disclosed herein.

With respect to this invention, it is noted that it is directed to a circuit which receives already demodulated and digitized signals in which both left and right channel information is present. Accordingly, it is the function of the circuit of the present invention to produce digitized output signals representing extracted left channel and right channel information.

Conventionally, recovery of the 19 kHz pilot tone in FM receivers is accomplished using totally analog circuitry and design principles. These principles typically involve the use of a phase locked loop which locks onto the 19 kHz tone with a 38 kHz oscillator whose output is applied to a frequency divider which divides the frequency by a factor of two. Recovery of the pilot tone is essential for separating the left and right channel information signals.

However, it is not enough simply to provide a digital filter whose frequency response is such that the 19 kHz tone is passed through unattenuated while substantially all other frequencies are rejected. In order to provide the mechanism for producing the desired 38 kHz tone for ultimate channel separation, it is necessary that proper phase relationships in the signal output be present. Furthermore, while it is known that it is relatively easy to construct digital circuitry for performing operations such as addition and subtraction, it is also known that it is correspondingly much more difficult to provide digital circuitry for operations such as multiplication. Accordingly, one of the desirable features of an appropriate digital filter is an implementation in which a minimal number of multiplication operations is to be performed. In the preferable case in which the circuitry of the present invention is implemented on an integrated circuit chip, the problems of chip size and "real estate" also dictate that there be as few digital multiplication circuits as possible to conserve both space and power.

SUMMARY OF THE INVENTION

In accordance with a preferred embodiment of the present invention, a digital filter having a special form to reduce the number of multiplications required is employed to produce a digitized representation of the 19 kHz pilot tone together with another sampled output representing the 19 kHz tone shifted by a phase angle of 90°. This allows the production of the desired 38 kHz stereo carrier signal which is used to resolve the incoming signal into left and right channel components. In the preferred embodiment of the present invention, the digital filter is operated at a sampling rate of 228 kHz which is 12 times the 19 kHz frequency of the pilot tone. Operation at this sampling rate is very beneficial in terms of circuit simplicity particularly in terms of the need for a minimal number of multiplier circuits. A first digital multiplier circuit is used to form the product of the output of the digital filter at a certain time with the output of the filter at an earlier time to produce the digitized representation of the 38 kHz stereo carrier signal. This signal is then employed in connection with a second digital multiplier whose output represents a digitized version of the "left minus right" signal. A simple summer and subtractor are thereafter employed to extract the left and right channels in distinct signal paths.

Accordingly, it is an object of the present invention to provide a digital circuit for decoding demodulated and digitized FM stereo signals into left and right channel components.

It is also an object of the present invention to provide a digital circuit for stereo FM decoding which employs a minimal number of multiplier circuits.

It is yet another object of the present invention to provide a digital channel separation circuit which is amenable to fabrication on an integrated circuit chip, either by itself or as part of other decoding and demodulation circuitry.

It is still another object of the present invention to contribute to digital processing of FM signals.

Lastly, but not limited hereto, it is an object of the present invention to provide a digital circuit for FM stereo signal decoding which requires small space, low power and is readily fabricated on a single integrated circuit chip.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
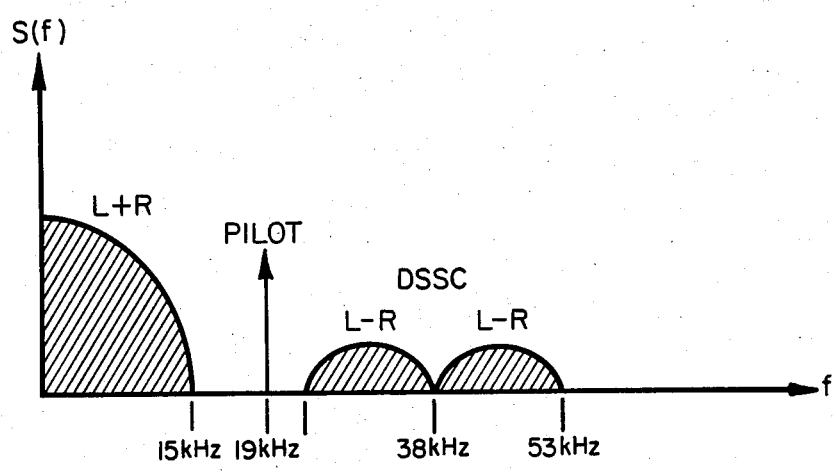
FIG. 1 is a plot of the spectrum of a typical demodulated FM stereo signal as a function of frequency, f.

A proper understanding of the operation of the present invention can only be had with a knowledge of the spectral distribution of the signal which is applied to the circuit of the present invention. A demodulated FM signal includes a essentially the three distinct components referred to above. In particular, the demodulated FM signal includes, in the frequency range from 0 to 15 kHz, a signal representing the sum of the left and right stereo channels, L+R. At a frequency of 19 kHz±2 Hz, as required by current FCC regulations, there is provided a 19 kHz pilot tone. Centered around a frequency of 38 kHz, which is twice the pilot tone frequency, left minus right channel information, L−R, is encoded in a double side band suppressed carrier (DSSC) signal. The left minus right channel information typically lies in a frequency band of from 23 kHz to 53 kHz, as shown. The spectrum of the signal shown in FIG. 1 is then essentially the spectrum of the signal which is provided as an input to the present invention, albeit in digitized form.

The design of the digital filter circuit of the present invention is based upon the design of a digital filter for extracting a digitized representation of the 19 kHz pilot tone. However, to accomplish the objectives of the present invention, it is not enough simply to apply conventional design methodologies to produce a digital filter having an extremely narrow pass band at a frequency of 19 kHz. In particular, the present inventors have selected a sampling rate for their digital filter which results in a greatly simplified implementation. Moreover, not only must the filter of the present invention produce a digitized sinusoidal 19 kHz signal, but it must also operate in such a way as to be able to readily produce a cosinusoidal version of the same signal. In order to provide circuit simplicity, it is also necessary to select additional pole locations for the z transform transfer function describing the digital filter in a special fashion. Moreover, once having selected additional transform poles for circuit simplification purposes, it also becomes necessary to select nearby transfer function zeros to produce a transfer function which effectively has only a single narrow passband centered at a frequency of 19 kHz.

Figure 2:
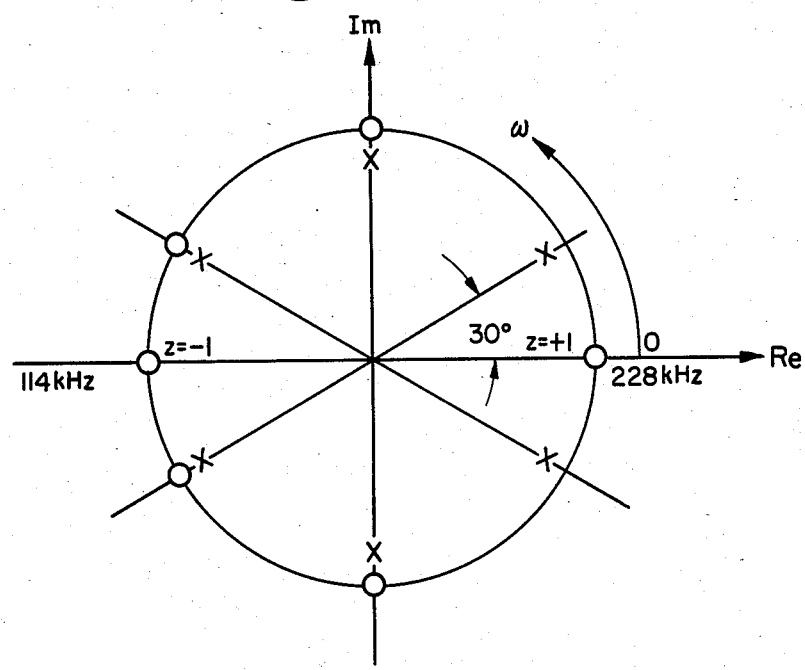
FIG. 2 is a pole-zero diagram in the complex plane representing the z-transform function for the preferred embodiment of the filter of the present invention.

FIG. 2 represents a preferred embodiment of the digital filter of the present invention for the case in which the number M of poles chosen is 6. In particular, the diagram shown in FIG. 2 is a pole-zero plot of the z transform H(z) of the preferred embodiment of the digital filter of the present invention. In this particular case, the number M of poles of H(z) is 6 and the sampling rate is 228 kHz which is equal to 2M×19 kHz. In the diagram of FIG. 2 as is the convention, transfer function zeros are designated with O's and transfer function poles are designated by X's. As is also known in the arts relating to digital signal processing, various points along the unit circle shown correspond to different values of angular frequency ω. In particular, an angle of 0° corresponds to a frequency of 0 Hz. As one moves in a counterclockwise direction as measured from the positive real axis along the unit circle, the value of ω increases monotonically with the angle at 180° corresponding to a frequency of 114 kHz and with an angle of 360 corresponding to a frequency of 228 kHz in the present design. Since it is an object of the present invention to have a large response at a frequency of 19 kHz, it is therefore seen that it is necessary to have a pole located at an angle of 30° with respect to the positive real axis since 30° is to 360° as 19 kHz is to 228 kHz. However, as is also known in the digital signal processing arts, it is not desirable to have poles located directly on the unit circle since such pole locations lead to instability. Accordingly, the pole shown at an angle of 30° is located just within the unit circle. For reasons which will become clearer later, the pole shown at the 30° angle (and other poles also) preferably lies at a distance of $1-2^{2-N}$ from the origin. N can be any real number greater than 2 but is preferably an integer such as 8. Since the poles or zeros are required to occur in complex conjugate pairs for creating realizable circuits, a second matching pole is required at an angle of 330°.

If producing a sharp response peak at a frequency of 19 kHz were the only design objective of the present invention, one might be satisfied with poles at only those two locations, namely, at 30° and 330°. However, for purposes of circuit simplification, the filter of the present invention employs a number of poles distributed uniformly around a circle which lies just within the unit circle. In the present case, because the sampling rate is 228 kHz, a total of M=6 poles is selected, each pole being separated from its adjacent pole on the inner circle by an angle of 360°/M. This distribution of poles provides a transfer function whose denominator is of the form $z^M+\beta$. As discussed above, $\beta$ is typically selected to be of the form $1-2^{2-N}$. However, the inclusion of the additional poles at angles of 90°, 150°, 210° and 270° would normally produce undesirable components in the filter output. In other words, with these poles alone being present, the filter would act to pass frequencies other than those desired. Accordingly, the design of the present invention employs zeros at these angles at locations adjacent to the poles to mitigate their effects. Accordingly, transfer functions zeros are provided at angles of 90°, 150°, 210°, and 270° as shown in FIG. 2. However, these zeros are located on the unit circle itself. Such locations also serve to promote circuit simplicity in that the algebraic expansion of the factors involving these zeros do not result in the generation of coefficients requiring digital multiplication circuitry. In general, the zeros also occur in complex conjugate pairs and exhibit sufficient symmetry to promote implementation without excessive multiplication. However, the zeros situated at angles of 150° and 210° do not have correspondingly symmetrically located zeros in the right half plane. To place such zeros there would naturally defeat the 19 kHz selectivity of the filter. Additionally, zeros are provided at z=+1 and z=−1 to eliminate dc components and to further promote circuit simplicity.

Accordingly, it is seen that the preferred digital filter embodiment of the present invention possesses a z-transform transfer function which is substantially equal to $$H(z) = H\frac{(z^2+1)(z^2-1)(z^2+\sqrt{3}z+1)}{z^6+(1-2^{2-N})}$$

wherein N is a real number greater than 2 and H is a scale factor. The above equation can be expanded and both the numerator and denominator divided by a factor of $z^6$. Doing so results in the following:

$$H(z) = H \frac{1 + \sqrt{3}(z^{-1} - z^{-5}) + z^2 - 2^{-4} - z^{-6}}{1 + (1 - 2^{2-N})z^{-6}}.$$

The second formula above for H(z) provides a much more direct form for indicating the input/output relationship for the digital filter. In particular, it is seen that $$y(n) = H[x(n) + x(n-2) - x(n-4) - x(n-6) + 1.7320508 (x)(n-1) - x(n-5))] - .984375\, y(n-6).$$

In the above N=8. The scale factor H is 0.00282. In the above equation the sampling period T has been suppressed for simplicity in accordance with often employed inventions. The equation above for (n) is written in a form which is readily implementable in digital circuitry.

Figure 3:
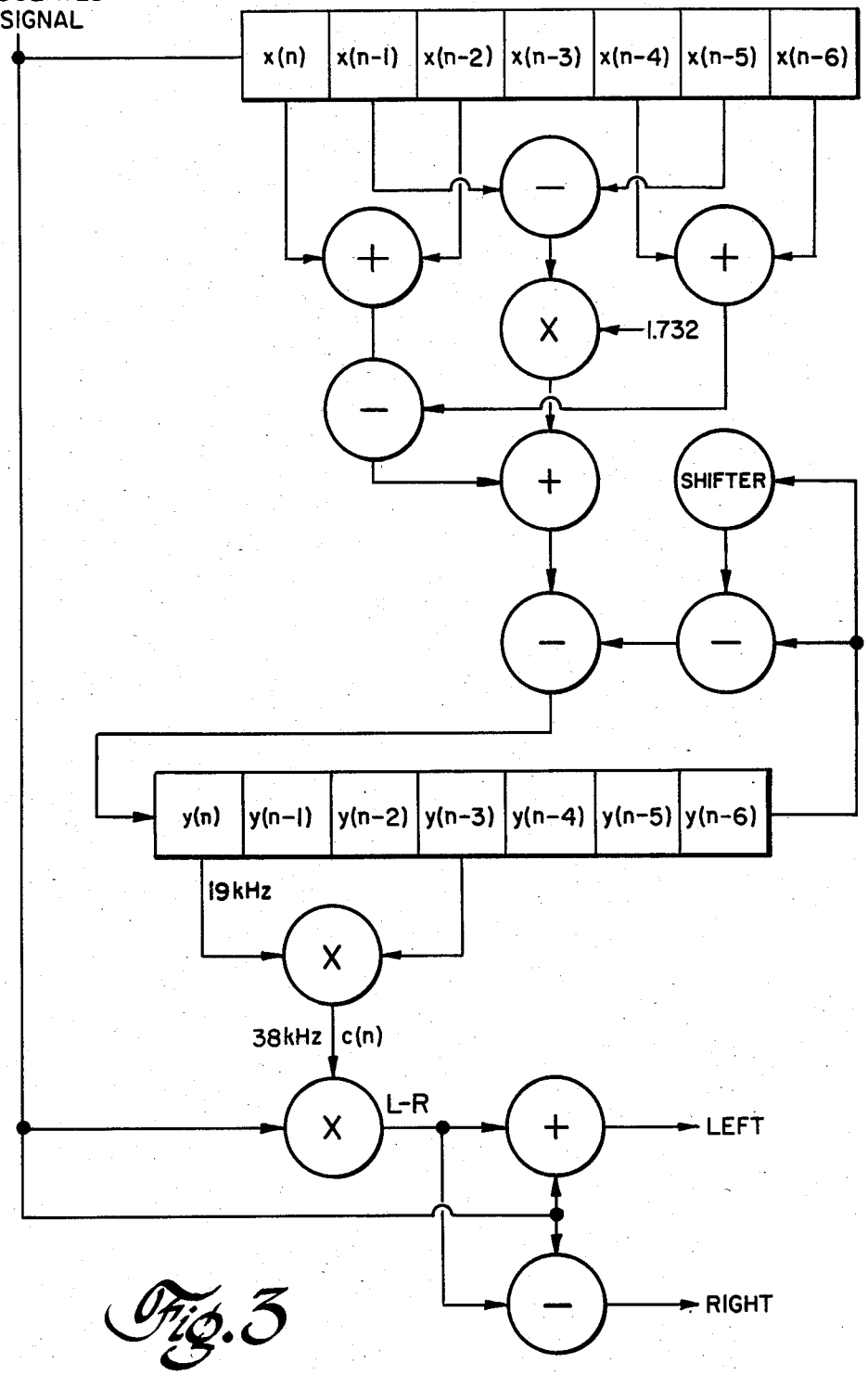
FIG. 3 is a flow diagram describing the desired physical implementation of the present invention.

The particular circuit for implementing the above digital filter is shown in FIG. 3. For example, the circuit of FIG. 3 includes a clocked shift register for storing digitally represented values x(n) through x(n−6). Additionally, the output y(n) is also supplied to a set of clocked shift registers and similarly labeled. The digital circuit of FIG. 3 also includes adders, subtractors, and multipliers as shown. A shifter is also shown which substitutes for a multiplication step. The digital filter portion of the circuit shown in FIG. 3 is essentially that part of the circuit between the shift registers for the x values and the shift registers for the y values, inclusive. It is readily seen that the output y(n) is generated by the circuit shown. In particular, terms associated with x(n−1) and x(n−5) have been grouped together in a difference operation prior to multiplication by 1.732 which, in four significant digits, represents the decimal version of $\sqrt{3}$. This grouping is therefore seen to reduce the number of digital multipliers required. It is also seen that the digital filter portion of the present invention whose embodiment is shown in FIG. 3, includes only this single multiplier. This is a significant advantage of the present invention. Additionally, by choosing N to be an integer greater than 2 in the above equation for H(z), it is possible to employ a shifter in place of a multiplier. Again, as is well known, multiplication by a power of 2 is readily accomplished in positional binary systems by a simple shift operation. The value N controls the proximity of the poles and zeros which lie adjacent to one another in FIG. 2. The higher the value of N, the closer the poles and zeros become. However, for practical implementation and avoidance of stability problems, N is preferably chosen in the present invention to be an integer near 8.

Accordingly, it is seen that the digital filter circuit described above produces as an output y(n) a digitized representation of the 19 kHz pilot tone. Since the filter operates at a sampling rate of 228 kHz, each sample y(n) through y(n−6) is separated by a phase angle of 30° since 2M, which is equal to 12, divides 360° into 30° segments. Accordingly, the sample taken at y(n−3) represents a cosinusoidal signal since it exists in a phase shift relationship of 90° with respect to y(n). Use is now made of the following trigonometric identity:

Sin X Cos Y = ½[Sin (X+Y)+Sin (X−Y)].

In the particular case at hand, X=Y and it is seen that Sin X Cos Y = ½ Sin 2X. Accordingly, the present invention employs a multiplier to form the product of y(n) and y(n−3) to produce the resulting signal c(n) which represents a 38 kHz stereo carrier signal. In general, from the above trigonometric identity, it is seen that multiplication operates to produce the sum of two signals, one of which is based upon the sum of the two frequencies, and the other of which is based upon the difference of the two frequencies. It is to be noted in the filter described above that the selection of the number of poles M=6 for the digital filter provides an output signal y(n−3) which exhibits the proper phase with respect y(n) to enable the production of the 38 kHz stereo carrier signal c(n) as the output of a digital multiplier circuit.

The generation of the signal c(n) enables the production of the signal labeled L−R in FIG. 3 which represents the algebraic difference between the left and right stereo channels. Based upon the principles incorporated in the above mentioned trigonometric identity, multiplication by the 38 kHz stereo carrier signal operates to shift the L−R portion of the incoming signal into the frequency range between 0 and 15 kHz. It also operates to frequency shift this portion of the signal into a band centered around 76 kHz, but since such frequency ranges are inaudible, this portion of the resulting signal shown can be ignored. In a like manner, the spectral information centered around 38 kHz in the incoming digitized and demodulated FM signal can also be ignored since it is also likewise inaudible to the human ear or may be filtered out later. The only relevant portion then of the input signal is its L+R portion. Accordingly, a simple digital summer is provided which adds the L−R signal generated above to the incoming signal containing the L+R portion to produce a signal which substantially represents the digitized portion of the left channel. In a similar manner, a subtractor is also employed in the manner shown in FIG. 3 to produce the right channel. Symbolically, this is written as (L+R)−(L−R)=2R. In this manner then, the digital circuit of the present invention operates to decode the digitized and demodulated FM signal into its left and right hand stereo components.

Accordingly, it is seen that the digital circuit of the present invention provides a means for digitally decoding regularly broadcast FM stereo signals using digital circuitry which incorporates only three digital multipliers. In fact, the digital filter portion of the circuit of the present invention incorporates only a single digital multiplier. Such simply implementable filters are therefore readily seen to be incorporated in integrated circuits for FM stereo decoding purposes. It is also seen that such circuits require less chip area and less electrical power. While the circuit shown in FIG. 3 is the circuit of preference in the present invention, it is also noted that the shifter and subtractor which receive inputs from the register containing y(n−6) could be replaced by an additional multiplier circuit in the case that N is not an integer value. Additionally, it is noted that the discussion above has not at all referred to the number of bits employed the various registers, shifters, adders, subtractors, and multipliers shown in FIG. 3. Various values may be employed without departing from either the scope or spirit of the present invention. However, for the purposes of separating FM stereo signals, 8 to 15 bits may be employed with 10 or 12 bits being preferred for this particular application. It is also noted that the sampling rate preferably employed herein is well above the Nyquist rate required for accurate signal reproduction.

It is also noted that the output signals from the left and right channels in the present invention are typically supplied to digital-to-analog conversion devices and low pass filters for removing high frequency content which may be undesirably present as a result of the quantization and conversion processes.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A digital circuit for decoding a demodulated and digitized FM stereo signal comprising at least stereo carrier, L+R, and L−R signals into digitized left and right channel components, said circuit comprising:

a digital filter for receiving said digitized FM stereo signal as an input sequence x(nT) and generating an output sequence y(nT), said filter having a z-transform transfer function substantially equal to $$H(z) = H \frac{(z^2 + 1)(z^2 - 1)(z^2 + \sqrt{3}z + 1)}{z^6 + (1 - 2^{2-N})}$$

where N is a real number greater than 2 and H is a scale factor, said filter operating a sampling rate with period T corresponding to a sampling rate which is substantially equal to 228 kHz;

a first digital multiplier circuit for forming the product of the output of said filter at time nT, y(nT), with the output of said filter at time (n−3)T, y(nT−3T), so as to form a digitized representation of the stereo carrier signal, c(nT); and a second digital multiplier circuit for forming the product of the input to said filter at time nT, x(nT), with the output of said first digital multiplier at time nT, c(nT), so as to form a digitized representation of the L−R signal.

2. The signal circuit of claim 1 further comprising:

a digital summation circuit to form the sum of said L−R signal from said second digital multiplier and said input signal x(nT), whereby a signal representing said left stereo channel information is produced; and a digital subtraction circuit to form the difference between said L−R signal and said input signal x(nT), whereby a signal representing said right stereo channel information is produced.

3. The circuit of claim 1 in which N is an integer.

4. The circuit of claim 1 in which N=8.

5. A digital filter circuit for receiving an input sequence x(nT) and generating an output sequence y(nT), said filter having a z-transform transfer function substantially equal to $$H(z) = H \frac{(z^2 + 1)(z^2 - 1)(z^2 + \sqrt{3}z + 1)}{z^6 + (1 - 2^{2-N})},$$

where N is a real number greater than 2 and H is a scale factor, said filter operating at a sampling rate with period T which corresponds to a sampling rate which is substantially equal to 228 kHz.

* * * * *